(12) United States Patent
Agrawal et al.

(10) Patent No.: US 11,842,775 B2
(45) Date of Patent: Dec. 12, 2023

(54) SYSTEMS AND METHODS FOR DYNAMICALLY SENSING A MEMORY BLOCK

(71) Applicant: SanDisk Technologies LLC, Addison, TX (US)

(72) Inventors: Nidhi Agrawal, San Jose, CA (US); Bo Lei, San Jose, CA (US); Zhenni Wan, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 226 days.

(21) Appl. No.: 17/506,960

(22) Filed: Oct. 21, 2021

(65) Prior Publication Data

US 2023/0126422 A1  Apr. 27, 2023

(51) Int. Cl.
| | | |
|---|---|---|
| *G11C 7/00* | (2006.01) | |
| *G11C 16/32* | (2006.01) | |
| *G11C 16/08* | (2006.01) | |
| *G11C 16/10* | (2006.01) | |
| *G11C 16/26* | (2006.01) | |

(52) U.S. Cl.
CPC ............ *G11C 16/32* (2013.01); *G11C 16/08* (2013.01); *G11C 16/102* (2013.01); *G11C 16/26* (2013.01)

(58) Field of Classification Search
CPC ....... G11C 7/1051; G11C 7/22; G11C 7/1072; G11C 7/1006; G11C 7/1066
USPC .................................... 365/189.15, 189.14
See application file for complete search history.

(56) References Cited

U.S. PATENT DOCUMENTS

| | | | |
|---|---|---|---|
| 2004/0141377 A1* | 7/2004 | Arai | G11C 16/0483 365/185.22 |
| 2014/0052940 A1* | 2/2014 | Gurgi | G06F 12/02 711/154 |

* cited by examiner

*Primary Examiner* — Son T Dinh
(74) *Attorney, Agent, or Firm* — DICKINSON WRIGHT PLLC; Steven C. Hurles

(57) ABSTRACT

A memory device that dynamically adjusts the sense time to read an open block of a memory block is disclosed. The adjusted sense time is based upon various considerations, including the sense time of the closed block equivalent and the openness of the open block. This allows the memory device to maintain a fixed Vt as well as reduce failed bit count, i.e., read errors due to an insufficient sense time. Also, the dynamic adjustment of sense time can optimize system performance and increase efficiency.

20 Claims, 15 Drawing Sheets

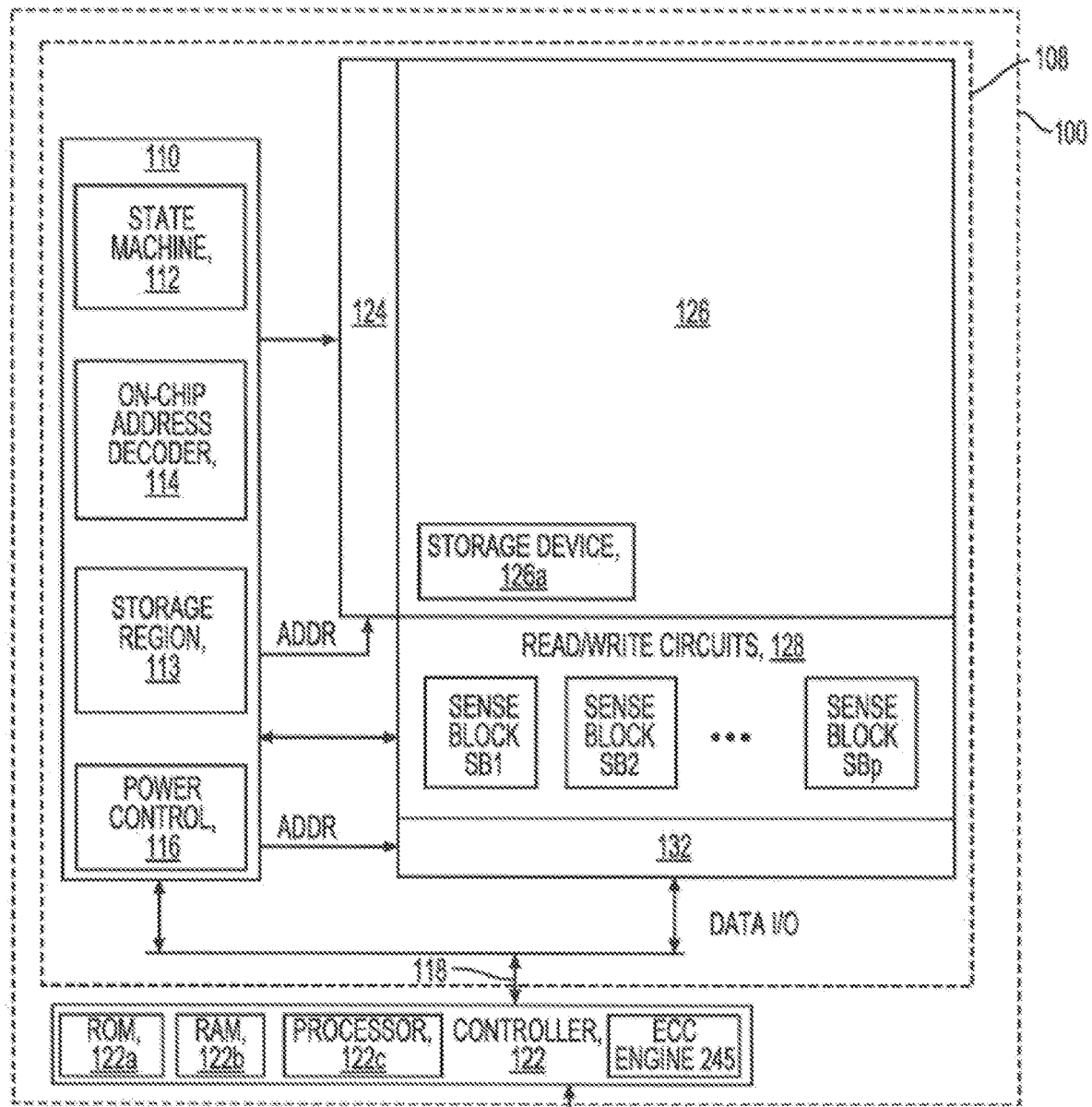
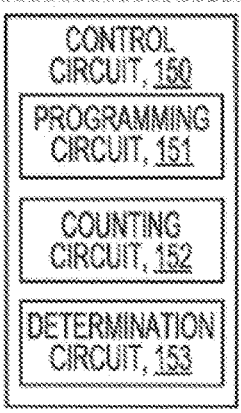
FIG. 1A
FIG. 1B

1200

| [7] | [6] | [5] | [4] | [3] | [2] | [1] | [0] | Slope |
|---|---|---|---|---|---|---|---|---|
|   |   |   |   |   | 0 | 0 | 0 | Disable |
|   |   |   |   |   | 0 | 0 | 1 | 0.0005 |
|   |   |   |   |   | 0 | 1 | 0 | 0.0010 |
|   |   |   |   |   | 0 | 1 | 1 | 0.0015 |
|   |   |   |   |   | 1 | 0 | 0 | 0.0020 |
|   |   |   |   |   | 1 | 0 | 1 | 0.0025 |
|   |   |   |   |   | 1 | 1 | 0 | 0.0030 |
|   |   |   |   |   | 1 | 1 | 1 | 0.0035 |

| [7] | [6] | [5] | [4] | [3] | [2] | [1] | [0] | $OB\_WL_n$ |
|---|---|---|---|---|---|---|---|---|
|   |   |   |   |   | 0 | 0 | 0 | 1 |
|   |   |   |   |   | 0 | 0 | 1 | 20 |
|   |   |   |   |   | 0 | 1 | 0 | 40 |
|   |   |   |   |   | 0 | 1 | 1 | 60 |
|   |   |   |   |   | 1 | 0 | 0 | 80 |
|   |   |   |   |   | 1 | 0 | 1 | 100 |
|   |   |   |   |   | 1 | 1 | 0 | 111 |
|   |   |   |   |   | 1 | 1 | 1 | Not used |

FIG. 12B

SYSTEMS AND METHODS FOR DYNAMICALLY SENSING A MEMORY BLOCK

TECHNICAL FIELD

This application is directed to sensing times for reading a memory block. In particular, this application is directed to dynamically changing the sensing time of an open block based in part on the particular characteristics of the open block. The sensing time can change (i.e., increase or decrease) based upon the number of erased, or non-programmed, cells. As a result, the read errors can be reduced.

BACKGROUND

In order to read from a memory block, a voltage is provided to a word line of the memory block. Typically, a closed block (i.e., all memory cells are programmed) can be read using a known threshold voltage and pre-determined sensing time. However, reading from an open block (i.e., at least some memory cells are not programmed) presents different challenges. For example, given a threshold voltage, the sense time required to properly (i.e., without significant error) read the memory block can vary based on the number of open cells in the open block. This may require different threshold voltages, which can then alter the sense current at the memory cells.

SUMMARY

According to an aspect of the present disclosure is related to a method for accessing a block of a memory device. The method includes determining a number of non-programmed cells of the block, wherein the block is configured to be read using a first sensing time. The method further includes adjusting, based on the number of non-programmed cells, from the first sensing time to a second sensing time. The method further includes reading, using the second sensing time, the block.

In an embodiment, determining the number of non-programmed cells includes retrieving the number of non-programmed cells from system firmware.

In an embodiment, comparing the retrieved number with a range of numbers defined by a minimum number and a maximum number. Additionally, the method includes when the retrieved number is between the minimum number and the maximum number, using a first parameter to adjust to the second sensing time.

In an embodiment, the method includes receiving a second parameter to adjust to the second sensing time, the second parameter based on a maximum number of word lines of the block.

In an embodiment, the first parameter is equal to the maximum number.

In an embodiment, the block includes an open block defined by one or more non-programmed memory cells equal to the number of non-programmed cells.

In an embodiment, the first sensing time is based upon a close block sensing time, and the close block sensing time is based on the block in which each memory cell of the block is programmed.

According to another aspect of the disclosure, a memory system includes a memory device. The memory system further includes a controller operatively coupled to the memory device. The controller is configured to determine a number of non-programmed cells of the block, wherein the block is configured to be read using a first sensing time. The controller is further configured to adjust, based on the number of non-programmed cells, from the first sensing time to a second sensing time. The controller is further configured to read, using the second sensing time, the block.

In an embodiment, the controller is further configured to determine the number of non-programmed cells includes retrieving the number of non-programmed cells from system firmware.

In an embodiment, the controller is further configured to compare the retrieved number with a range of numbers defined by a minimum number and a maximum number. Additionally, the controller is further configured to, when the retrieved number is between the minimum number and the maximum number, use a first parameter to adjust to the second sensing time.

In an embodiment, the controller is further configured to receive a second parameter to adjust to the second sensing time, the second parameter based on a maximum number of word lines of the block.

In an embodiment, the first parameter is equal to the maximum number.

In an embodiment, the block includes an open block defined by one or more non-programmed memory cells equal to the number of non-programmed cells.

In an embodiment, the first sensing time is based upon a close block sensing time, and the close block sensing time is based on the block in which each memory cell of the block is programmed.

According to another aspect of the disclosure, a non-transitory computer readable storage medium configured to store instructions that, when executed by a processor included a controller of a memory system, cause the memory system to carry out steps to determine a number of non-programmed cells of the block, wherein the block is configured to be read using a first sensing time. The memory system is further configured to carry out the steps to adjust, based on the number of non-programmed cells, from the first sensing time to a second sensing time. The memory system is further configured to carry out the steps to read, using the second sensing time, the block.

In an embodiment, the controller is further configured to determine the number of non-programmed cells includes retrieving the number of non-programmed cells from system firmware.

In an embodiment, the controller is further configured to compare the retrieved number with a range of numbers defined by a minimum number and a maximum number. Additionally, the controller is further configured to, when the retrieved number is between the minimum number and the maximum number, use a first parameter to adjust to the second sensing time.

In an embodiment, the controller is further configured to receive a second parameter to adjust to the second sensing time, the second parameter based on a maximum number of word lines of the block.

In an embodiment, the first parameter is equal to the maximum number.

In an embodiment, the block includes an open block defined by one or more non-programmed memory cells equal to the number of non-programmed cells.

In an embodiment, the first sensing time is based upon a close block sensing time, and the close block sensing time is based on the block in which each memory cell of the block is programmed.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIG. 1A is a block diagram of an example memory device;

FIG. 1B is a block diagram of an example control circuit that includes a programming circuit, a counting circuit, and a determination circuit;

FIGS. 12A and 12B show tables that provide values used to calculate $T_{SENSE\_OB}$, in accordance with some described embodiments.

DETAILED DESCRIPTION

Figure 2:
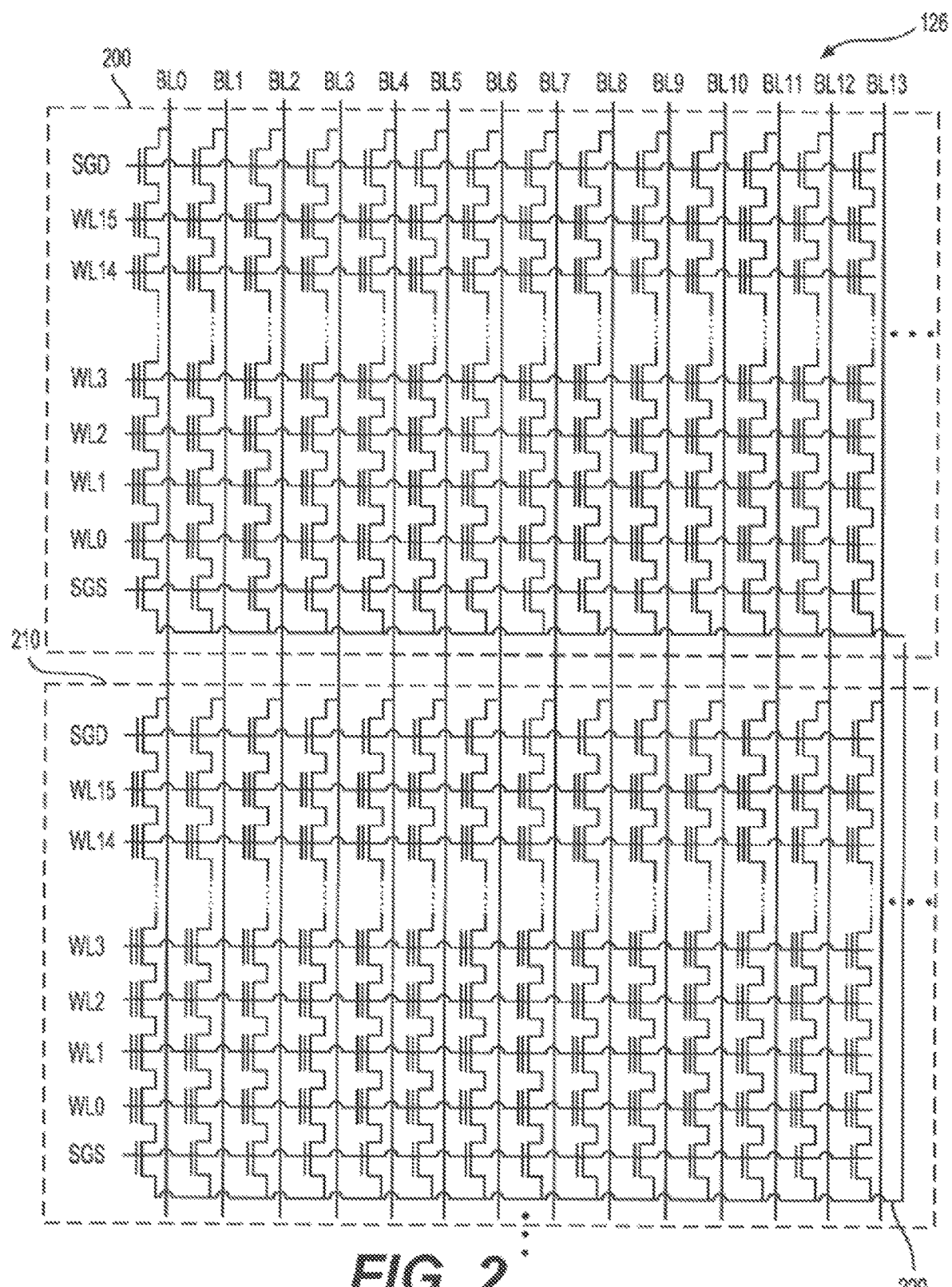
FIG. 2 illustrates schematic views of three types of memory architectures utilizing staggered memory strings.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The following disclosure is related to dynamically changing the sense time used to read an open block. An open block refers to a block in which one or more memory holes (or cells) are not programmed and storing data. Further, the openness, or degree to which the open block is not being used, is also accounted for when changing the sense time. In the detailed description and in the claims, "openness" refers to the maximum number of word lines minus the numbered word line being read or sensed. In this manner, openness can refer to the number of unused memory holes, memory cells, or word lines. Using the techniques described herein, the sense time can be adjusted based on the openness (along with other factors described herein), thus allowing the threshold voltage to remain similar to that of the closed block case (i.e., when all memory holes are programmed and storing data).

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates schematic views of three types of memory architectures utilizing staggered memory strings. For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

FIG. 2 illustrates blocks 200, 210 of memory cells in an example two-dimensional configuration of the memory structure 126 of FIG. 1. The memory structure 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

Figure 3A:
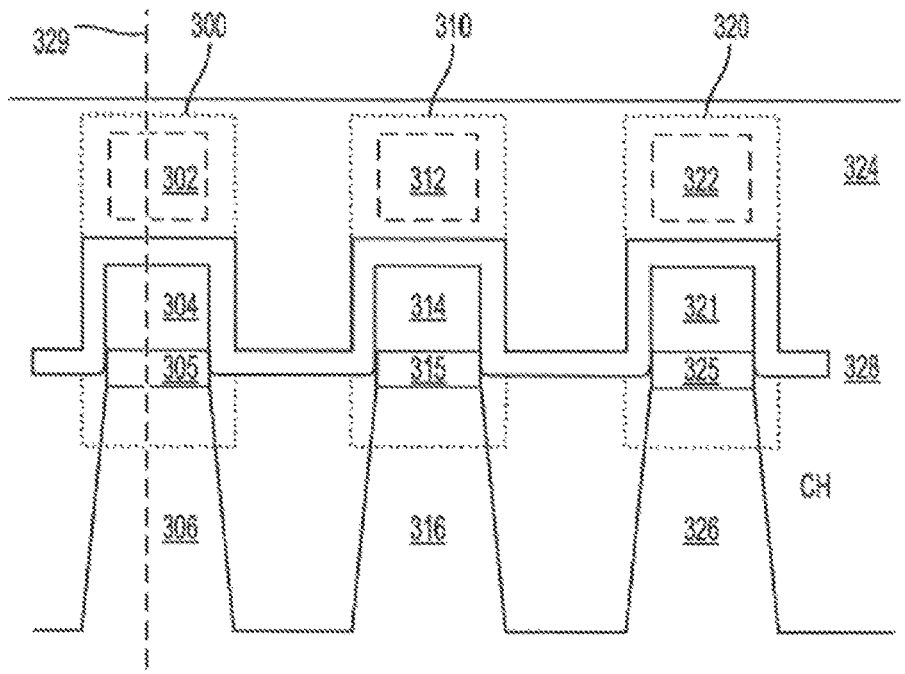
FIG. 3A illustrates a cross-sectional view of example floating gate memory cells in NAND strings.
Figure 3B:
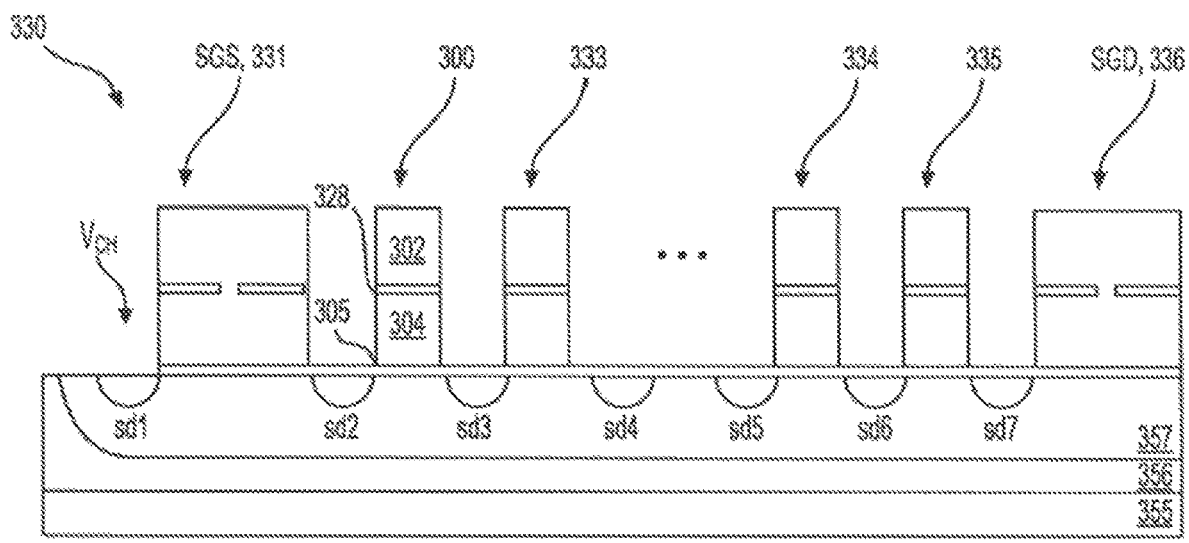
FIG. 3B illustrates a cross-sectional view along a contact line shown in FIG. 3A.

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
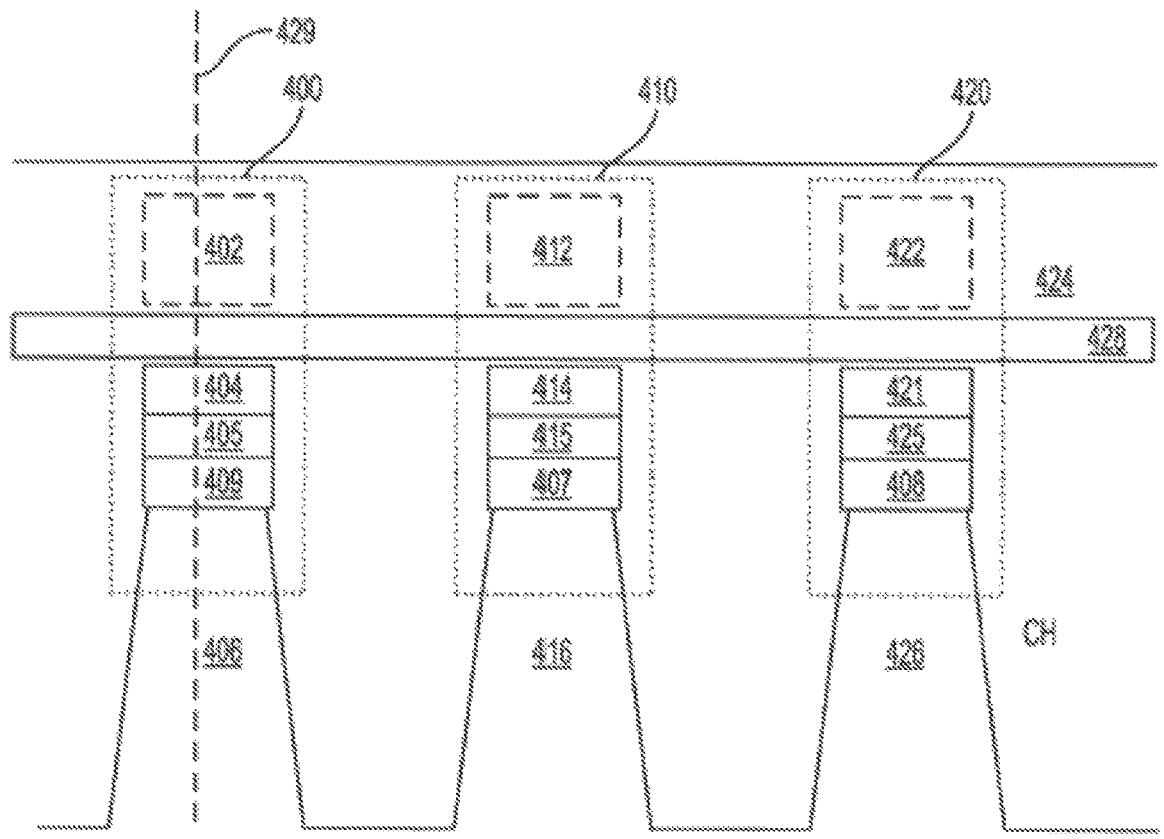
FIGS. 4A and 4B illustrate non-volatile memory in which a charge-trapping memory cell uses a non-conductive dielectric material in place of a conductive floating gate to store charge in a non-volatile manner.
Figure 4B:
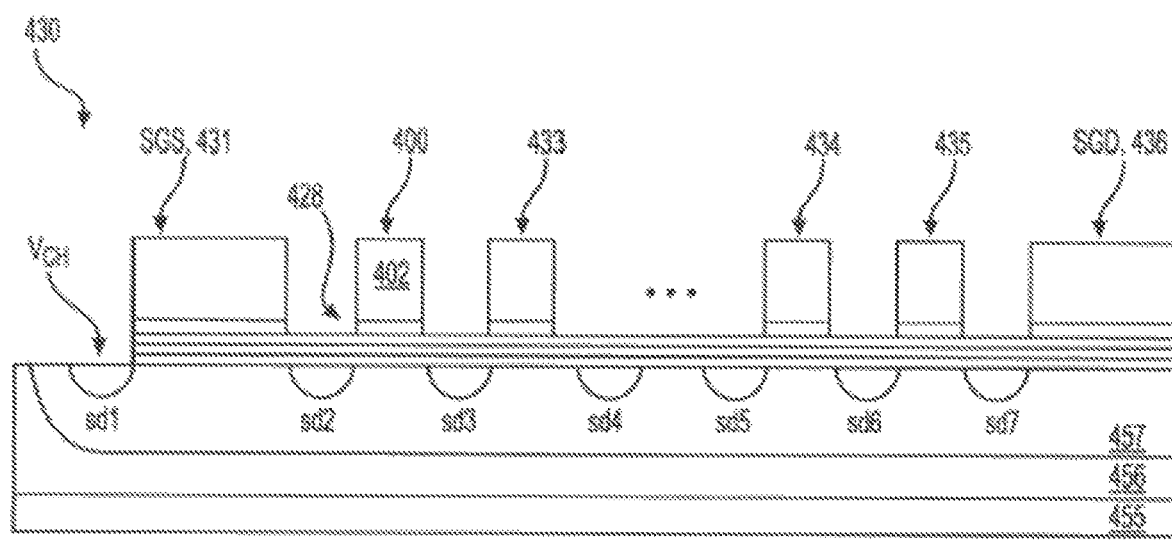

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell structure 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
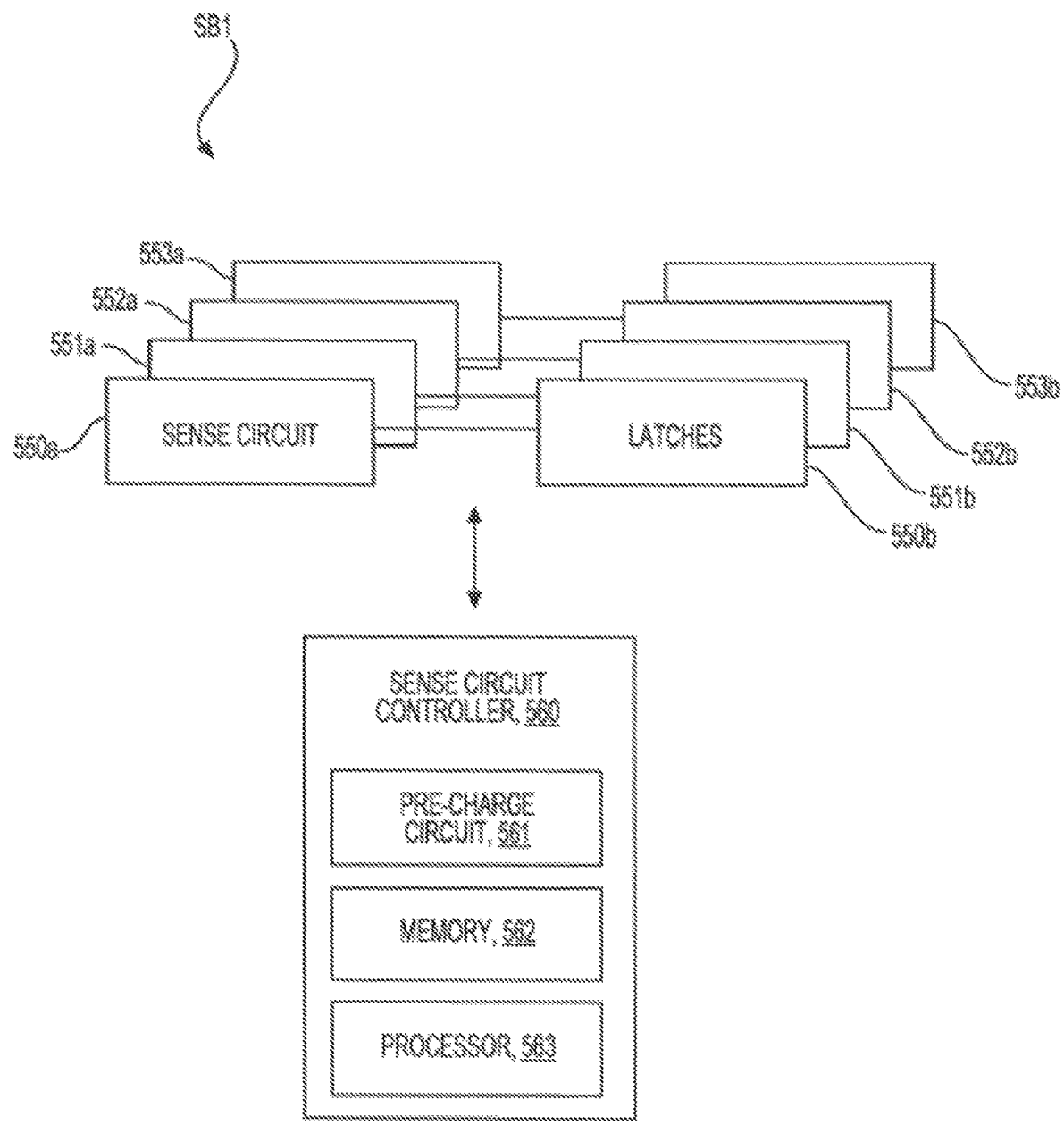
FIG. 5 illustrates an example block diagram of the sense block of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
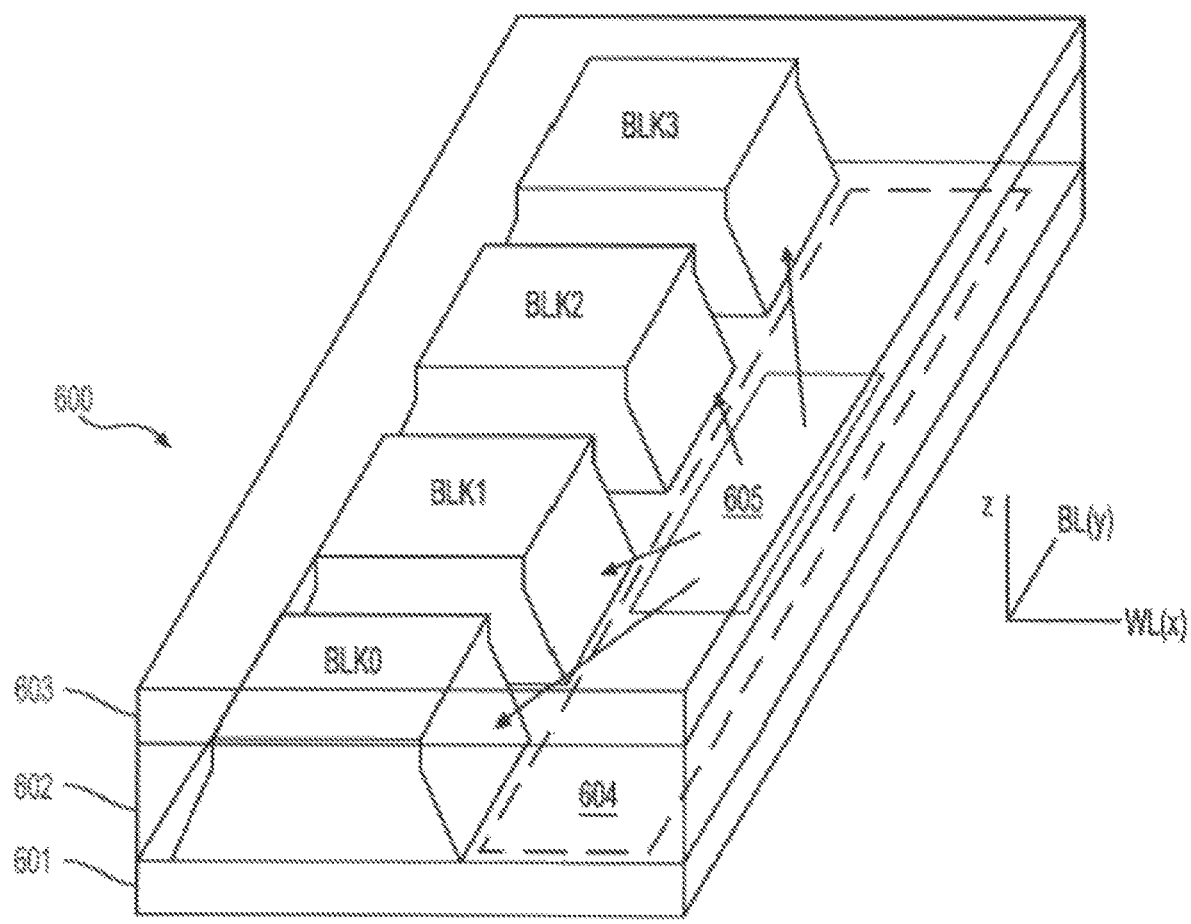
FIG. 6A is a perspective view of a set of blocks in an example three-dimensional configuration of the memory array of FIG. 1.

FIG. 6A is a perspective view of a set of blocks 600 in an example three-dimensional configuration of the memory structure 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
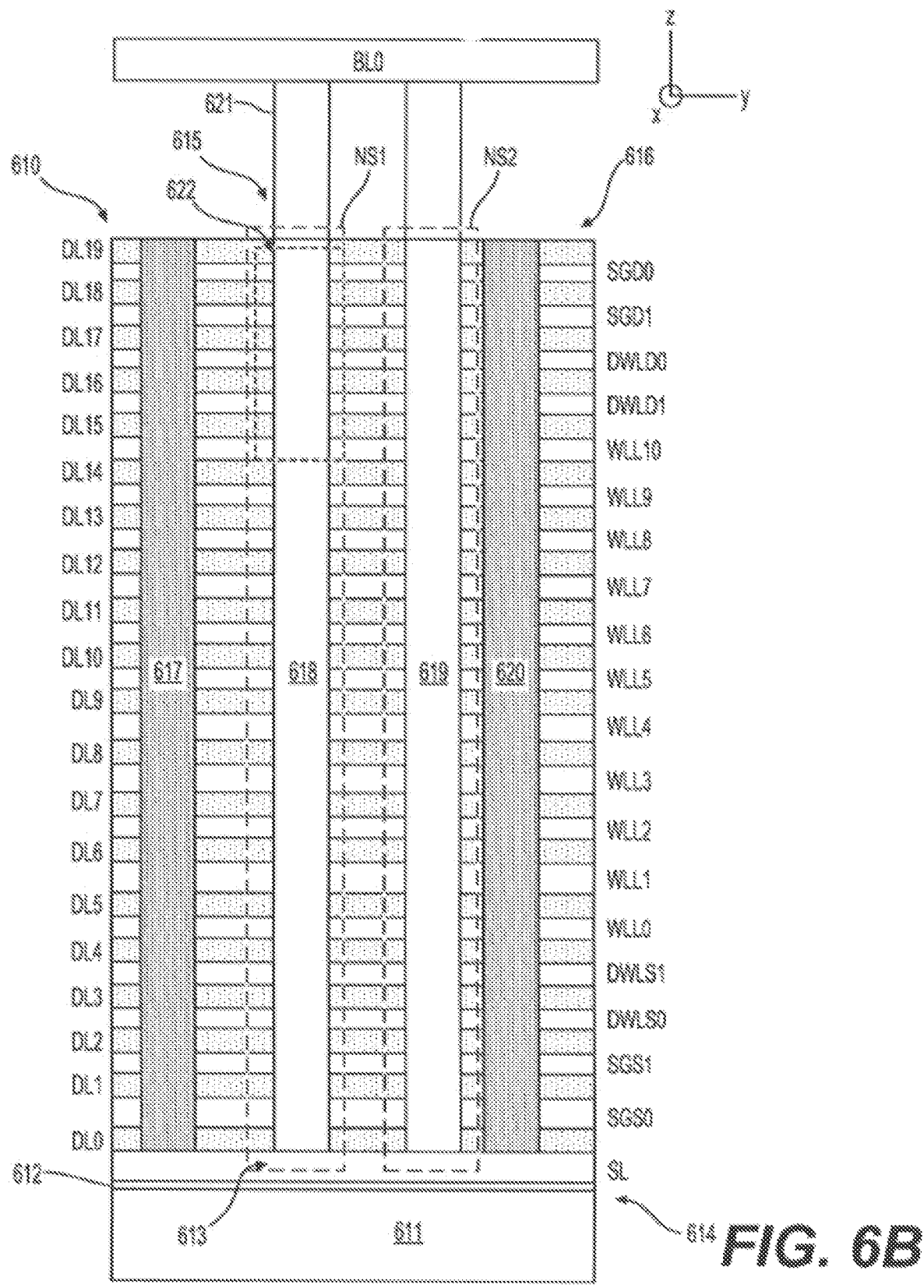
FIG. 6B illustrates an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
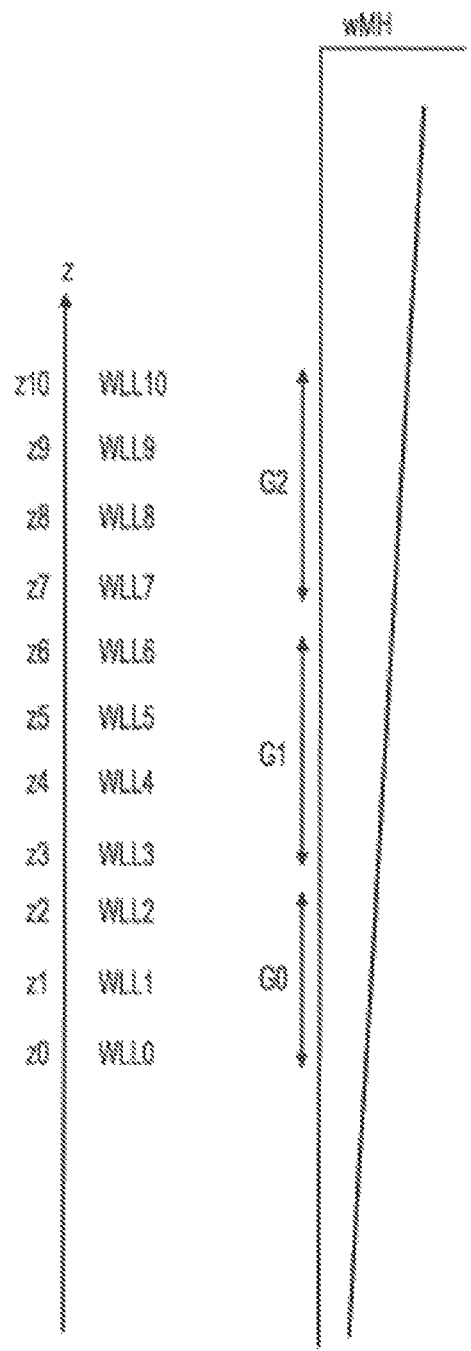
FIG. 6C illustrates a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
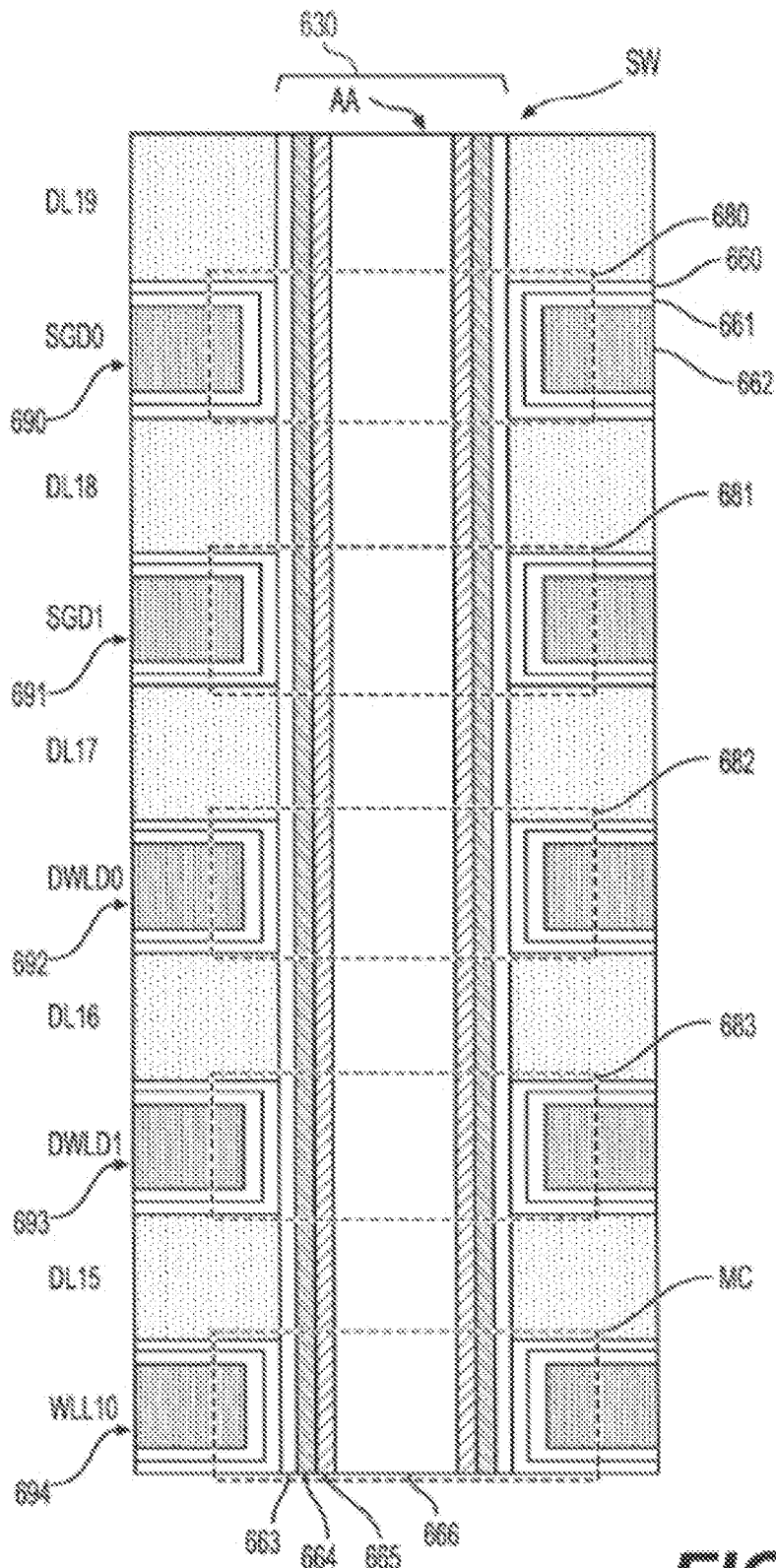
FIG. 6D illustrates a close-up view of the region of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a data memory cell MC is programmed, electrons are stored in a portion of the charge-trapping layer 663 which is associated with the memory cell MC. These electrons are drawn into the charge-trapping layer 663 from the channel 665, and through the tunneling layer 664. The Vth of a memory cell MC is increased in proportion to the amount of stored charge. During an erase operation, the electrons return to the channel 665.

Each of the memory holes 630 can be filled with a plurality of annular layers comprising a blocking oxide layer, a charge trapping layer 663, a tunneling layer 664 and a channel layer 665. A core region of each of the memory holes 630 is filled with a body material, and the plurality of annular layers are between the core region and the word line in each of the memory holes 630.

The NAND string can be considered to have a floating body channel 665 because the length of the channel 665 is not formed on a substrate. Further, the NAND string is provided by a plurality of word line layers above one another in a stack, and separated from one another by dielectric layers.

Figure 7A:
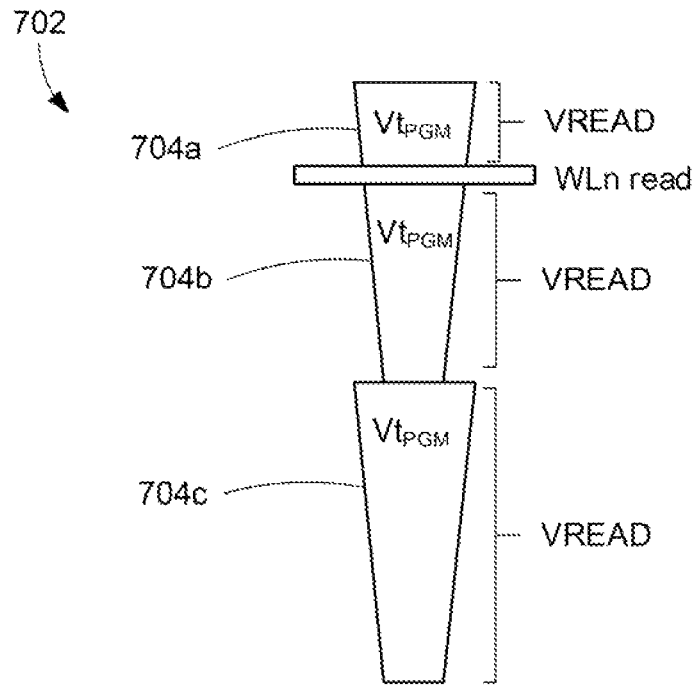
FIG. 7A illustrates a diagram of a memory block in a fully programmed state, in accordance with some described embodiments.

FIG. 7A illustrates a diagram of a memory block 702 in a fully programmed state, in accordance with some described embodiments. As shown, the memory block 702 includes several memory cells, such as memory cells 704a, 704b, and 704c. Each of the memory cells 704a, 704b, and 704c is designed to store electrons, with the electron storage corresponding to a bit, e.g., 0 or 1. For example, for single-level cell ("SLC") technology, each memory hole electrons correspond to a "1" (denoting an erased state) or a "0" (denoting a programmed state). Alternatively, single-level cell ("SLC") technology, each memory hole electrons correspond to a "0" (denoting an erased state) or a "1" (denoting a programmed state). As shown, each of the memory cells 704a, 704b, and 704c are programmed (e.g., with user data). In this regard, each of the memory cells 704a, 704b, and 704c, when read, requires at least a threshold voltage corresponding to programmed threshold voltage, $Vt_{PGM}$. Due to each of the memory cells 704a, 704b, and 704c being in a programmed state, the memory block 702 may be referred to as a close block ("CB").

Figure 7B:
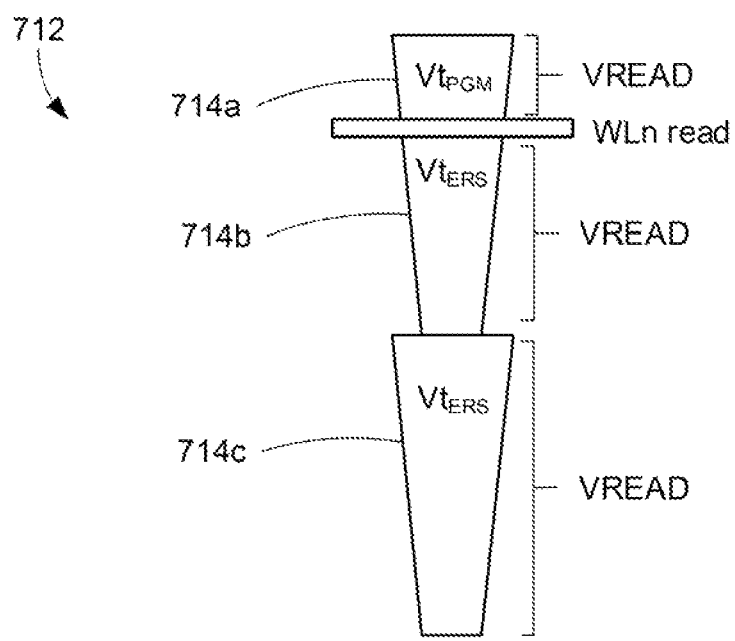
FIG. 7B illustrates a diagram of a memory block in a partially programmed state, in accordance with some described embodiments.

Conversely, FIG. 7B illustrates a diagram of a memory block 712 in a partially programmed state (or partially erased state), in accordance with some described embodiments. As shown, the memory block 712 includes several memory cells, such as memory cells 714a, 714b, and 714c. The memory hole 714a includes $Vt_{PGM}$, indicating a threshold voltage corresponding to a programmed state is required for sensing/reading, while each of the memory cells 714b and 714c includes a threshold voltage corresponding to an erased state, $Vt_{ERS}$. Due to one or more memory cells not yet programmed and thus in an erased state, the memory block 712 may be referred to as an open block ("OB"). The OB scenario can occur when one or more memory cells are not required to store data. While a particular number of memory cells are shown as programmed and erased in FIG. 7B, it is intended to be exemplary and the number may vary.

Referring to FIGS. 7A and 7B, "WLn" refers to a given word line (among a number of word lines) in the respective memory blocks. Moreover, referring to FIG. 7A, WLn represents the nth word lines such that all word lines above and below the nth word lines are in a programmed state. However, in FIG. 7B, WLn represents the nth word lines such that all word lines above the nth word lines are in a programmed state, and all word lines below the nth word lines are in an erased state. This characterization may apply to other exemplary embodiments. Also, "WLn read" indicates a read command applied to the nth word line, and the threshold voltage ("Vt") is measured at the nth word line. Also, various memory blocks shown and described herein may include a particular number of maximum word lines ("MaxWL") corresponding to a particular bit column stacked ("BiCS") technology. For example, in some memory devices, a memory block may have a maximum of one hundred and twelve (112) word lines, and in other memory devices; a memory block may have one hundred and sixty (160) word lines; and in still other memory devices, a memory block may have two hundred and twenty (220) word lines.

While CB and OB memory blocks are acceptable in NAND flash memory, read errors can occur when reading from the respective blocks. For example, at the same word line n, for the same applied voltage and the same sense time to read both CB and OB, the Vt levels for CB and OB may be different, indicating a read error. The resultant programmed Vt difference can lead to a different read for the same data. CB memory blocks, having all cells occupied by electrons (due to data storage of all cells), provides more electrical resistance as compared to OB memory block, in which a fraction of the cells are occupied by electrons (due to partial data storage of cells). Accordingly, for the same voltage applied, the measured current of a cell of an OB memory block is higher than that of the measured current of a cell of a CB memory block, based on the equation $$I=V/R \qquad (1)$$

where I is the current, V is the voltage, and R is the resistance.

Figure 8:
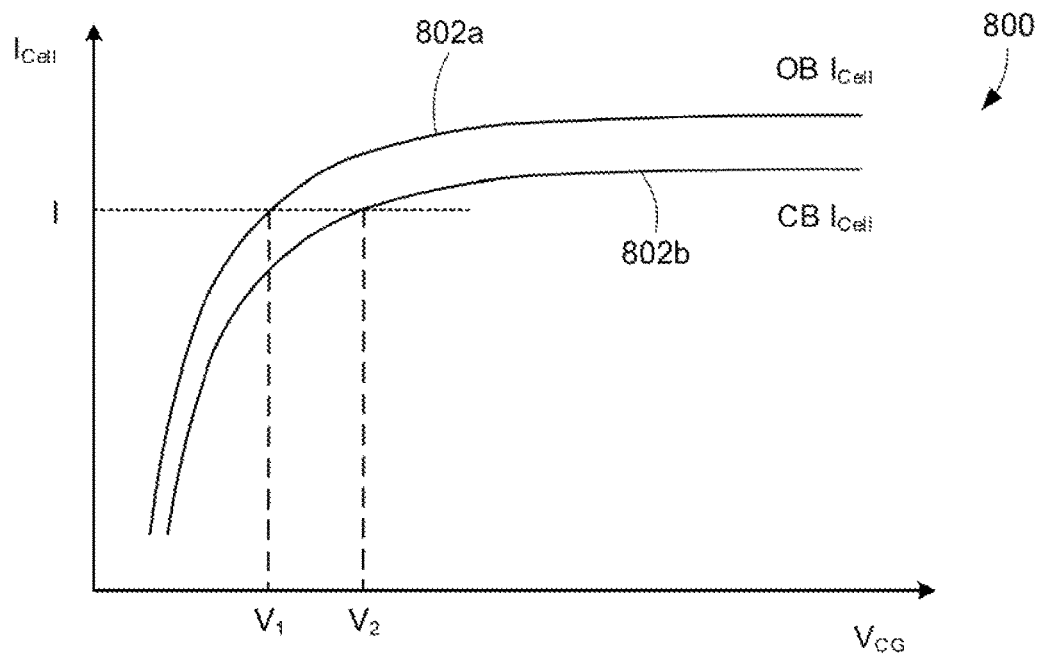
FIG. 8 illustrates a graph showing current vs voltage for a CB and a OB cell under an applied voltage.

FIG. 8 illustrates a graph 800 showing current vs voltage for a CB and a OB cell under an applied voltage. The x-axis is the gate voltage ("$V_{CG}$") and the y-axis is the cell current measured at the nth word line ("$I_{Cell}$"). As shown, a curve 802a denotes the measured current of an OB memory block cell ("OB $I_{Cell}$"), and a curve 802b denotes the measured current of a CB memory block cell ("CB $I_{Cell}$"). Based on the graph 800, for a measured current, I, to be equal for both OB cell and a CB cell, two different $V_{CG}$ voltages, $V_1$ and $V_2$, must be applied to the OB memory block and the CB memory block, respectively. Further, $V_2$ is greater than $V_1$, indicating the CB cell are programmed to a higher Vt to achieve the same current, as compared to the OB cell. This is due to the OB memory block providing less resistance as compared to the CB memory block. Conversely, the graph 800 shows that for the same voltage, the measured cell current—for the nth wordline of an OB cell and of a CB cell—is higher for the OB cell.

Figure 9:
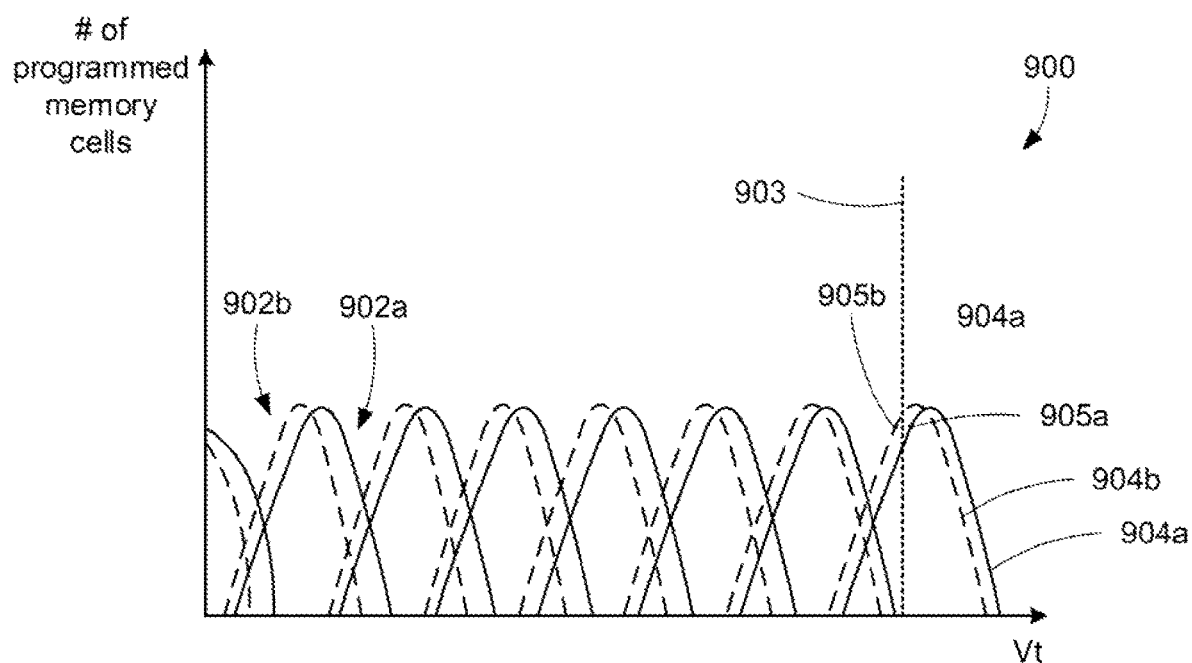
FIG. 9 illustrates a graph 900 showing the number of memory cells versus threshold voltage, in accordance with some described embodiments.

FIG. 9 illustrates a graph 900 showing the number of memory cells versus threshold voltage, in accordance with some described embodiments. As shown, a curve 902a (solid line) denotes the number of programmed memory cells in a CB memory block cell for a given Vt, and a curve 902b (dotted line) denotes the number of memory cells in an OB memory block cell for a given Vt. The graph 900 shows eight (8) pulses, which can represent eight (8) different data states in a memory system (e.g., triple-level cell or TLC). Additionally, in some embodiments (not shown), a graph can show sixteen (16) pulses, which can represent sixteen (16) different data states in a memory system (e.g., quad-level cell or QLC). Accordingly, the various advantageous techniques shown and described herein may apply to TLC and QLC NAND flash technology. In order to determine whether a data state represents a zero (0) bit or a one (1) bit, a read level (represented by a vertical line) passes through each data state (represented by a lobe). Due to the presence of OB memory cells, the Vt is shifted lower for each data state. While the read level 903 does not change, a lobe 904b of the curve 902b represents a shift. This shift by the lobe 904b (and other lobes shown) can lead to failed bit counts ("FBC"), or errors, during a sense operation to read from the OB and CB. The graph 900 illustrates a back pattern effect that differs for CB and OB. For a particular nth cell, a CB memory block will have all cells programmed after the nth cell is programmed, whereas for an OB memory block, each cell after the nth cell is erased.

Figure 10A:
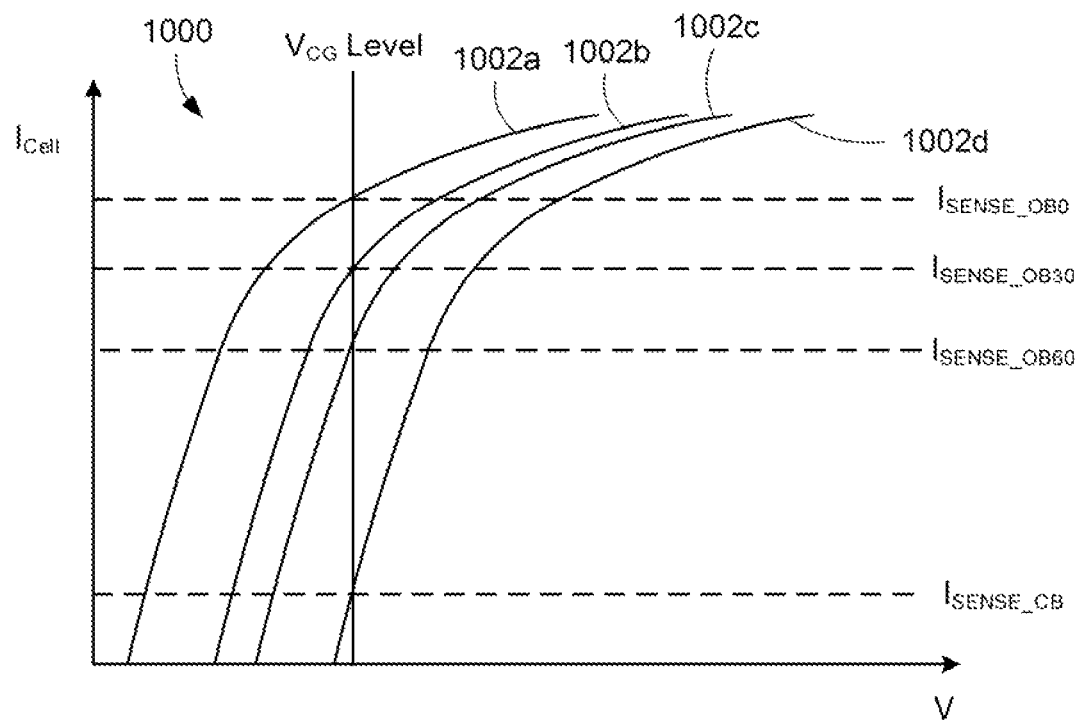
FIG. 10A illustrates a graph showing current versus voltage for cells under various conditions, in accordance with some described embodiments.

FIG. 10A illustrates a graph 1000 showing current versus voltage for cells under various conditions, in accordance with some described embodiments. The x-axis represents a voltage, V, and the y-axis represents the cell current, Ica', measure at the voltage. The graph 1000 shows curves 1002a, 1002b, 1002c, and 1002d. Each of the curves 1002a, 1002b, 1002c, and 1002d shows a measured current of a different cell in a memory block. In this regard, each of the curves 1002a, 1002b, 1002c, and 1002d represents measured current of cells with different openness. Further, for the nth word line chosen in an open block, it is presumed that n-1 word lines (and all prior word lines) are in a programmed state, and n+1 (and all subsequent word lines) are in an erased state.

As an example, for a memory block with 112 word lines (WL0 through WL111), the openness of the curves 1002a, 1002b, 1002c, and 1002d varies. In this regard, the curve 1002a may represent the measured current of the 0th (initial or first) word line in an open block ("OB WL0"), with openness 111 (111 minus 0). The curve 1002b may represent the measured current of the 30th word line in an open block ("OB WL30"), with openness 81 (111 minus 30). The curve 1002c may represent the measured current of the 60th word line in an open block ("OB WL60"), with openness 51 (111 minus 60). Finally, the curve 1002d may represent the measured current of the last word line of the memory block, thus the block is close block ("CB") and has openness 0 (111 minus 111). Accordingly, for a memory block in which the nth word line is chosen to be sensed, the openness is inversely proportional to the nth word line chosen. In this manner, the openness decreases for a higher n.

As can be seen in the graph 1000, for the same voltage, $V_{CG}$, used to turn on the cell, the sensed current, $I_{SENSE}$, at each cell differs based on the openness. Each of the dotted horizontal lines represents the voltage $V_{CG}$ intersects each of the curves 1002a, 1002b, 1002c, and 1002d, respectively. It can be readily seen that the sensed current for CB, $I_{SENSE}$ CB, at $V_{CG}$ is significantly lower than the sensed current for an open block sensed at the 60th word line ("$I_{SENSE\_OB60}$") of the memory block, which lower than the sensed current for an open block sensed at the 30th word line ("$I_{SENSE\_OB30}$") of the memory block, which is lower than the sensed current for an open block sensed at the 0th word line ("$I_{SENSE\_OB0}$") of the memory block. Accordingly, an applied Vt may result in different read information based on the variation in openness. Ideally, however, the $I_{SENSE}$ is consistent, or substantially the same, for a given Vt.

Figure 10B:
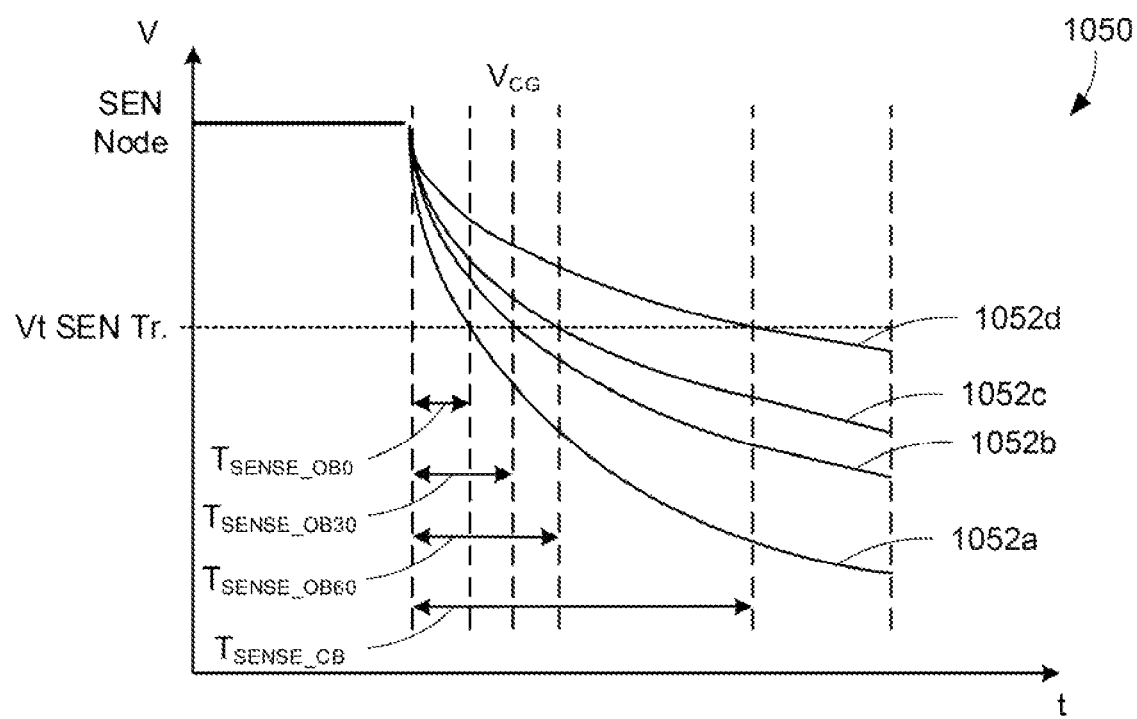
FIG. 10B illustrates a graph showing voltage versus time for cells measured in FIG. 10A.

FIG. 10B illustrates a graph 1050 showing voltage versus time for cells measured in FIG. 10A. The graph 1050 shows several voltage curves for different openness, with each curve representing the measured voltage at a node of the cell that is being sensed. For example, the curve 1052a represents the measure voltage at the cell of an open block with sensed at the 0th word line ("OB WL0") of the memory block, the curve 1052b represents the measure voltage at the cell of an open block with sensed at the 30th word line ("OB WL30") of the memory block, the curve 1052c represents the measure voltage at the cell of an open block with sensed at the 60th word line ("OB WL60"), and the curve 1052d represents the measure voltage at the cell of a closed block (CB).

It can be seen that the sensing node voltage level is constant, or fixed, at the value SEN node for an initial time duration. In view of FIG. 10A, it can be readily seen from FIG. 10B that the voltage dissipates faster for the higher current scenarios. In other words, the curve 1052a (OB WL0), corresponding to the relatively high-current scenario in FIG. 10A, shows the voltage dissipates faster as compared to the other curves 1052b, 1052c, and 1052d. Further, it can be seen from FIG. 10B that the voltage dissipates faster for greater openness, as the curve 1052*b* (OB WL30) declines faster than the curve 1052*c* (OB WL60), which declines faster than the curve 1052*d* (CB).

Further, the graph 1050 shows the required sense time ("T$_{SENSE}$") increasing for less openness. For example, the required sense time for the 0th word line ("T$_{SENSE\_OB0}$") is the shortest time interval, while the required sense time for the closed block ("T$_{SENSE\_CB}$") is the longest time interval. It can also be seen that the required sense time for the 30th word line ("T$_{SENSE\_OB30}$") is longer than T$_{SENSE\_OB0}$, but shorter than the required sense time for the 60th word line ("T$_{SENSE\_OB60}$"), and T$_{SENSE\_OB60}$ is shorter than T$_{SENSE\_CB}$. The following provides a process for optimizing T$_{SENSE}$.

The graph 1050 shows that the corresponding reduction of T$_{SENSE}$ is needed to sense similar Vt (Vt SEN Tr.) with the OB cases (T$_{SENSE\_OB0}$, T$_{SENSE\_OB30}$, and T$_{SENSE\_OB60}$), as obtained with the CB case (T$_{SENSE\_CB}$). In order to maintain the fixed voltage at the value SEN node, T$_{SENSE}$ must proportionally change with I$_{SENSE}$. For the CB cases, the sense time (T$_{SENSE\_CB}$) and sense current (I$_{SENSE\_CB}$) can be readily determined, and the sense time for the OB cases (T$_{SENSE\_OB}$) can be determined by $$I_{SENSE\_CB} * T_{SENSE\_CB} = I_{SENSE\_OB} * T_{SENSE\_OB} \quad (2)$$

where I$_{SENSE\_OB}$ is the sense current for an OB case. By rearranging terms in Eq. 2, it can be determined that $$T_{SENSE\_OB} = \frac{I_{SENSE\_CB}}{I_{SENSE\_OB}} * T_{SENSE\_CB}. \quad (3)$$

Figure 11A:
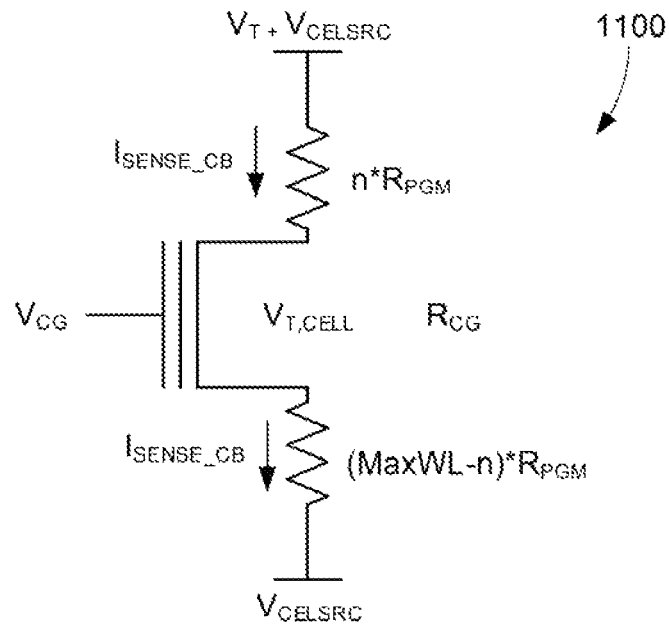
FIG. 11A illustrates a circuit diagram showing a cell in a CB memory block.

FIG. 11A illustrates a circuit diagram 1100 showing a cell in a CB memory block. As shown, during a sense operation, V$_{CG}$ is applied to the cell and the I$_{SENSE\_CB}$ passes through the cell (shown as a transistor) to be read. Using the values for voltage and resistance in FIG. 11A, as well as Eq. (1), the current I$_{SENSE\_CB}$ can be determined (proportionally) by $$I_{SENSE\_CB} \propto \frac{V_{BLC}}{R_{CG} + \text{Max}WL * R_{pgm}} \quad (4)$$

where V$_{BLC}$ is the bit line voltage, VCELSRC is the voltage at the source line CELSRC, n corresponds to the openness, MaxWL is the maximum number of word lines in the memory block, R$_{CG}$ is the resistance at the control gate, and R$_{pgm}$ is the resistance of the system due to the programmed state of the cell.

Figure 11B:
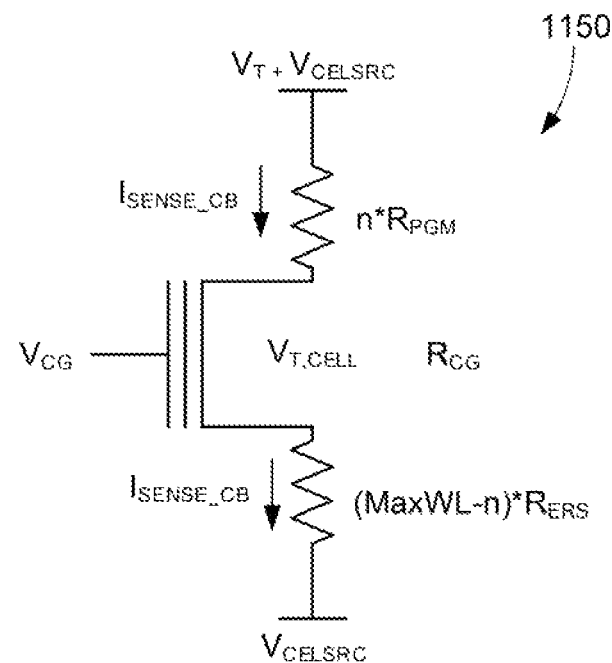
FIG. 11B illustrates a circuit diagram showing a cell in a OB memory block.

FIG. 11B illustrates a circuit diagram 1150 showing a cell in a OB memory block. As shown, during a sense operation, the I$_{SENSE\_OB}$ passes through the cell (shown as a transistor) to be read. Using the values for voltage and resistance in FIG. 11B, as well as Eq. (1), the current I$_{SENSE\_OB}$ can be determined (proportionally) by $$I_{SENSE\_OB} \propto \frac{V_{BLC}}{n * R_{pgm} + R_{CG} + (\text{Max}WL - n) * R_{ers}} \quad (5)$$

where R$_{ers}$ is the resistance of the system due to the erased state of the cell.

Using the foregoing equations, a derivation for T$_{SENSE\_OB}$ is determined. Using the derived equation for T$_{SENSE\_OB}$, the Vt for any OB scenario will be equivalent to the CB case, thus showing minimal risk of high FBC. Using Eqs. (3) through (5), T$_{SENSE\_OB}$ can be written as $$T_{SENSE\_OB} = \left( \frac{R_{CG} + n * R_{pgm} + (\text{Max}WL - n) * R_{ers}}{R_{CG} + \text{Max}WL * R_{pgm}} \right) * T_{SENSE\_CB}. \quad (6)$$

By further manipulation, Eq. (6) can further be simplified to $$T_{SENSE\_OB} = \left( 1 - \frac{(\text{Max}WL - n) * (R_{ers} - R_{ers})}{R_{CG} + \text{Max}WL * R_{pgm}} \right) * T_{SENSE_{CB}}. \quad (7)$$

Eq. (7) can be further manipulated to $$T_{SENSE\_OB} = (1 - m * (\text{Max}WL - n)) * T_{SENSE\_CB} \quad (8)$$

where $$m = \frac{(R_{ers} - R_{ers})}{R_{CG} + \text{Max}WL * R_{pgm}}. \quad (9)$$

Using Eqs. (8) and (9) and converting to parameters in NAND, T$_{SENSE\_OB}$ can further be written as $$T_{SENSE\_OB} = [1 - \text{SEN2\_MLC\_OB\_SLOPE} * (\text{MaxWL} - \text{OB\_WLN})] * \text{SEN2\_MLC} \quad (10)$$

where SEN2_MLC_OB_SLOPE is the open block slope, OB_WLN is n (i.e., the nth word line being sensed), and SEN2_MLC is T$_{SENSE\_CB}$.

Using Eq. (10), a NAND device (or controller thereof) can determine how to dynamically change T$_{SENSE\_OB}$. The parameters—MaxWL, T$_{SENSE\_CB}$—are fixed, and the parameters—n and m—can be determined based on openness. Accordingly, using the openness of the memory block, the sense time T$_{SENSE\_OB}$ can be optimized for different openness.

FIGS. 12A and 12B show tables that provide values used to calculate T$_{SENSE\_OB}$, in accordance with some described embodiments. The information provided by the tables can be inserted into Eq. (10) to solve for T$_{SENSE\_OB}$. Accordingly, memory devices described herein can retrieve information from the tables in FIGS. 12A and 12B.

FIG. 12A illustrates a table 1200 that provides values for the SEN2_MLC_OB_SLOPE parameter in Eq. (10). The values for the table 1200 can be found using empirical data. Based on some studies, for BiCS5 technology, the slope value "0.0020" in the table 1200 can be selected. However, other values may be possible.

FIG. 12B illustrates a table 1250 that provides values for the OB_WLN parameter in Eq. (10). The table 1250 provides different values based on the openness. As shown, the table 1250 is grouped into different zones. For example, the OB_WLN columns represents different groups of n, rather than list each n value. In this regard, when an open block is detected and the table 1250 is used, the NAND device can "round up" to the nearest value when n is not in the table 1250. For example, when n=45, the NAND device can select "60," as 45 lies between 40 and 60.

Figure 13:
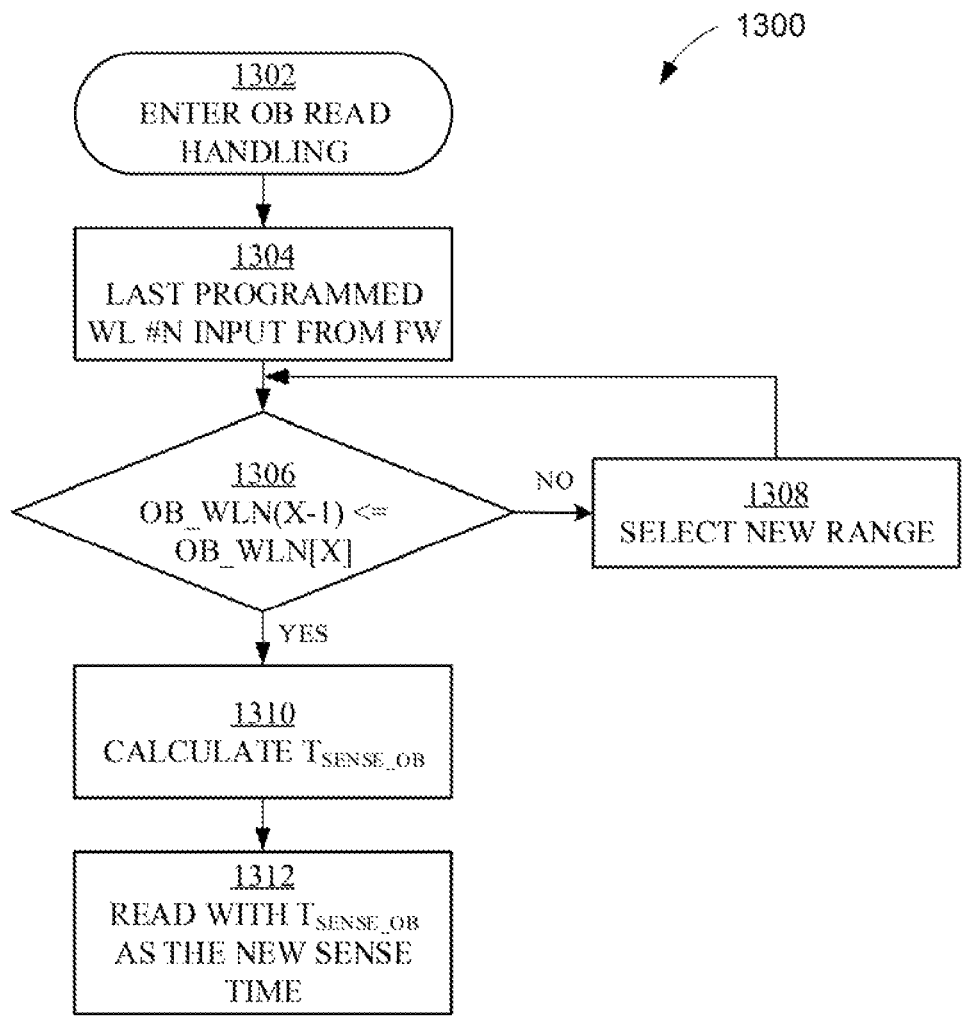
FIG. 13 illustrates a flowchart showing a method for dynamically sensing a memory block, in accordance with some described embodiments.

FIG. 13 illustrates a flowchart 1300 showing a method for dynamically sensing a memory block, in accordance with some described embodiments. Memory devices, including NAND flash memory devices, shown and described herein may include processing circuitry and memory circuitry to execute the instructions of the flowchart 1300.

In step 1302, the memory device determines an OB in the memory block and initiates the dynamic sensing for OB read.

In step 1304, the memory device determines the last known word line number, or n, which corresponds to the last program. The last word line number used may be retrieved from firmware ("FW"), as a non-limiting example. Using this information, n can be determined. Also, knowing the maximum word lines for the memory block, openness can be calculated by subtracting n from the maximum word line number.

In step 1306, a determination is made as to whether n values within the range of values in a table, which may include the table 1250 (shown in FIG. 12A). If n does not fall within the range, the process proceeds to step 1308, where a new range is selected. In n does fall within the range, the memory device can select the high value in the range (e.g., if n=45, then "60" is chosen from the table 1250).

In step 1310, the sense time $T_{SENSE\_OB}$ is calculated. As an example, Eq. (10) can be used to calculate $T_{SENSE\_OB}$.

In step 1312, the block is read using the new sense time. As a result, Vt can remain fixed while the sense time changes.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:

1. A method for accessing a block of a memory device, the method comprising:
   determining a number of non-programmed cells of the block, wherein the block is configured to be read using a first sensing time;
   adjusting, based on the number of non-programmed cells, from the first sensing time to a second sensing time; and
   reading, using the second sensing time, the block.

2. The method according to claim 1, wherein determining the number of non-programmed cells comprises retrieving the number of non-programmed cells from system firmware.

3. The method according to claim 2, further comprising:
   comparing the retrieved number with a range of numbers defined by a minimum number and a maximum number; and
   when the retrieved number is between the minimum number and the maximum number, using a first parameter to adjust to the second sensing time.

4. The method according to claim 3, further comprising receiving a second parameter to adjust to the second sensing time, the second parameter based on a maximum number of word lines of the block.

5. The method according to claim 3, wherein the first parameter is equal to the maximum number.

6. The method according to claim 1, wherein the block comprises an open block defined by one or more non-programmed memory cells equal to the number of non-programmed cells.

7. The method according to claim 1, wherein the first sensing time is based upon a close block sensing time, the close block sensing time based on the block in which each memory cell of the block is programmed.

8. A memory system, comprising:
   a memory device; and
   a controller operatively coupled to the memory device, the controller configured to:
     determine a number of non-programmed cells of the block, wherein the block is configured to be read using a first sensing time;
     means for adjusting, based on the number of non-programmed cells, from the first sensing time to a second sensing time; and
     read, using the second sensing time, the block.

9. The memory system according to claim 8, wherein the controller is further configured to determine the number of non-programmed cells by retrieving the number of non-programmed cells from system firmware.

10. The memory system according to claim 8, wherein the controller is further configured to:
    compare the retrieved number with a range of numbers defined by a minimum number and a maximum number; and
    when the retrieved number is between the minimum number and the maximum number, use a first parameter to adjust to the second sensing time.

11. The memory system according to claim 8, wherein the controller is further configured to receive a second parameter to adjust to the second sensing time, the second parameter based on a maximum number of word lines of the block.

12. The memory system according to claim 11, wherein the first parameter is equal to the maximum number.

13. The memory system according to claim 11, wherein the block comprises an open block defined by one or more non-programmed memory cells equal to the number of non-programmed cells.

14. The memory system according to claim 8, wherein the first sensing time is based upon a close block sensing time, the close block sensing time based on the block in which each memory cell of the block is programmed.

15. A non-transitory computer readable storage medium configured to store instructions that, when executed by a processor included a controller of a memory system, cause the memory system to carry out steps to:
    determine a number of non-programmed cells of the block, wherein the block is configured to be read using a first sensing time;
    adjust, based on the number of non-programmed cells, from the first sensing time to a second sensing time; and
    read, using the second sensing time, the block.

16. The non-transitory computer readable storage medium according to claim 15, wherein the controller is further configured to determine the number of non-programmed cells by retrieving the number of non-programmed cells from system firmware.

17. The non-transitory computer readable storage medium according to claim 15, wherein the instructions further cause the controller to carry out steps to:
    compare the retrieved number with a range of numbers defined by a minimum number and a maximum number; and
    when the retrieved number is between the minimum number and the maximum number, use a first parameter to adjust to the second sensing time.

18. The non-transitory computer readable storage medium according to claim 17, further comprising receiving a second parameter to adjust to the second sensing time, the second parameter based on a maximum number of word lines of the block.

19. The non-transitory computer readable storage medium according to claim 17, wherein the first parameter is equal to the maximum number.

20. The non-transitory computer readable storage medium according to claim 19, wherein the block comprises an open block defined by one or more non-programmed memory cells equal to the number of non-programmed cells.

\* \* \* \* \*